(12) United States Patent
Shimizu et al.

(10) Patent No.: US 8,118,940 B2
(45) Date of Patent: Feb. 21, 2012

(54) CLAMPING MECHANISM FOR SEMICONDUCTOR DEVICE

(75) Inventors: Akira Shimizu, Tama (JP); Akira Watanabe, Tama (JP)

(73) Assignee: ASM Japan K.K., Tokyo (JP)

( * ) Notice: Subject to any disclaimer, the term of this patent is extended or adjusted under 35 U.S.C. 154(b) by 1004 days.

(21) Appl. No.: 12/027,767

(22) Filed: Feb. 7, 2008

(65) Prior Publication Data
US 2009/0200251 A1    Aug. 13, 2009

(51) Int. Cl.
*C23C 16/00* (2006.01)
*C23F 1/00* (2006.01)
*H01L 21/306* (2006.01)

(52) U.S. Cl. .................. 118/728; 118/715; 156/345.51

(58) Field of Classification Search ................ 118/720, 118/721, 728–732, 719; 156/345.3, 345.51–345.55
See application file for complete search history.

(56) References Cited

U.S. PATENT DOCUMENTS

| | | | | |
|---|---|---|---|---|
| 5,632,873 A * | 5/1997 | Stevens et al. | ........... | 204/298.15 |
| 5,753,133 A * | 5/1998 | Wong et al. | ...................... | 216/67 |
| 5,820,686 A * | 10/1998 | Moore | ........................... | 118/730 |
| 6,355,108 B1 * | 3/2002 | Won et al. | ..................... | 118/728 |
| 7,276,123 B2 | 10/2007 | Shimizu et al. | | |
| 2004/0216998 A1 * | 11/2004 | Fu | ............................ | 204/298.11 |

* cited by examiner

*Primary Examiner* — Maureen Gramaglia
*Assistant Examiner* — Tiffany Nuckols
(74) *Attorney, Agent, or Firm* — Knobbe Martens Olson & Bear LLP

(57) ABSTRACT

A clamping mechanism for a semiconductor substrate includes: a C-shaped pickup plate; a susceptor top plate having a periphery adapted to receive and support an inner periphery portion of the C-shaped pickup plate thereon; and a clamp comprising (i) a top ring portion for clamping the substrate by sandwiching a periphery of the substrate between the top ring portion and the susceptor top plate and (ii) a pickup plate supporting portion adapted to support an outer periphery portion of the C-shaped pickup plate, wherein the C-shaped pickup plate is movable between the top ring portion and the pickup plate supporting portion, and the clamp is movable upward together with the C-shaped pickup plate and the susceptor top plate.

1 Claim, 7 Drawing Sheets

CLAMPING MECHANISM FOR SEMICONDUCTOR DEVICE

BACKGROUND OF THE INVENTION

1. Field of the Invention

The present invention generally relates to a clamping mechanism for a semiconductor substrate and a method for transferring a semiconductor substrate using the same.

2. Description of the Related Art

If a film is formed on a conventional apparatus using the wafer pin transfer method or an apparatus without wafer clamping mechanism, excited gases contact the edges and even back side of the wafer, thereby causing a film to form in these areas. If a film is formed on the back side of the wafer or in other unwanted areas, however, the back side, etc., must be cleaned after a film has been formed in order to prevent contamination of the apparatus in the subsequent steps, and this cleaning becomes particularly important in processes when a metal film is formed. Because of this cleaning, the productivity drops inevitably.

FIGS. 7(a) to 7(c) show partially enlarged schematic diagrams of a conventional structure using the wafer pin transfer method. FIG. 7(c) shows a condition when a wafer is being transferred, where a wafer 15 is placed on a robot hand 20 and transferred to a specified position on a susceptor 34 at the transfer position. A wafer lift pin 35 (normally there are three wafer lift pins) is running through a pin hole (through hole) provided in the susceptor 34 and projecting out. FIG. 7(b) shows a condition when wafer transfer has ended, where the robot hand 20 comes down and places the wafer 15 on the upper tip of the lift pin 35, while the susceptor 34 rises and the wafer is placed onto the susceptor 34 with the upper tip of the lift pin 35 remaining down, thereby completing the transfer. FIG. 7(a) shows a condition during processing, where the wafer 15 rises to the processing position while being placed on the susceptor 34, and a clamp 33 on a guide ring 32 placed on the projected part of a chamber wall 31 is caused to contact the outer periphery of the wafer 15, and in this condition the clamp 33 is raised so that the outer periphery of the wafer 15 is clamped. When being separated from the guide ring 32, the clamp 33 is placed at the outer periphery of the susceptor and the outer periphery of the wafer, to clamp the wafer by its outer periphery in order to reduce the forming of film around the edges and on the back side of the wafer. From the end of processing to wafer transfer, the same steps are followed in the reverse order.

However, in the atomic layer deposition process where multiple reactant gases are changed sequentially to form a film, pressure variation is particularly large in each of the gas change and purge steps and thus the flows of gases from the transfer chamber to the reaction chamber through the through holes for wafer lift pins cannot be prevented. Because of this, problems such as increased gas change time and generation of particles also occur on ALD apparatuses where gases must be changed quickly. Furthermore, when the conventional clamp is used it is necessary to consider A (margin for the chamber wall and guide ring)+B (margin for the guide ring and clamp)+C (margin for the clamp and susceptor)+D (margin for the susceptor top and wafer)+E (transfer accuracy of the robot) to achieve proper positioning with the wafer on the susceptor. Since each part is made of a different material and subject to different temperatures, a margin of approx. 1 mm is needed when the expansion coefficients, machining accuracies and safety factors of respective parts are considered, and therefore a structure becomes necessary where the outer periphery of the wafer is clamped by 1.5 mm or more to completely prevent forming of film on the back side. In this case, the worst level of positional deviation can create an area with a dimension of anywhere from 2.5 mm at the maximum to 0.5 mm at the minimum around the outer periphery of the wafer where film is not formed, and this reduces the in-plane uniformity.

SUMMARY OF THE INVENTION

In view of the above, in an aspect, an object of the present invention is to provide a clamping mechanism which effectively inhibits unwanted deposition on a back surface and an outer periphery of a wafer. In another object of the present invention is to provide a clamping mechanism which can clamp a wafer accurately, i.e., minimizing positional deviations every time a wafer is clamped on the susceptor. In still et another object of the present invention is to provide a clamping mechanism which can minimize a peripheral area where no deposition is performed (i.e., maximizing an area where a film is formed). In yet another object of the present invention is to provide a clamping mechanism which accomplishes clamping by simple structures. In an additional object of the present invention is to provide a method for transferring a wafer using any one of the foregoing clamping mechanisms.

In an embodiment wherein one or more of the above objects can be achieved, the present invention provides a clamping mechanism for a semiconductor substrate comprising: (I) a C-shaped pickup plate having an inner periphery portion, an outer periphery portion, and a cutout portion; (II) a susceptor top plate having a periphery adapted to receive and support the inner periphery portion of the C-shaped pickup plate thereon so as to move upward together with the C-shaped pickup plate, wherein a substrate supporting surface for placing a semiconductor substrate thereon is constituted by a top surface of the C-shaped pickup plate and a top surface of the top plate; and (III) a clamp comprising (i) a top ring portion for clamping the substrate by sandwiching a periphery of the substrate between the top ring portion and the substrate supporting surface and (ii) a pickup plate supporting portion adapted to support the outer periphery portion of the C-shaped pickup plate, wherein the C-shaped pickup plate is movable between the top ring portion and the pickup plate supporting portion, and the clamp is movable upward together with the C-shaped pickup plate and the susceptor top plate.

In another embodiment wherein one or more of the above objects can be achieved, the present invention provides a semiconductor processing apparatus comprising: (i) a chamber comprised of a reaction chamber and a transfer chamber; (ii) a showerhead disposed inside the chamber; (iii) a susceptor heater which is vertically movable and disposed inside the chamber facing the showerhead; and (iv) the foregoing clamping mechanism wherein the susceptor top plate is attached on top of the susceptor heater.

In still another embodiment wherein one or more of the above objects can be achieved, the present invention provides a method for transferring a substrate using the foregoing clamp mechanism, comprising: (a) processing a substrate placed on the substrate supporting surface constituted by the C-shaped pickup plate and the susceptor top plate, wherein the substrate is clamped between the top ring portion and the substrate supporting surface by clamping the periphery of the substrate by the ring portion, wherein the clamp is suspended and its own weight of the claim is exerted on the periphery of the substrate; (b) lowering the susceptor top plate together with the clamp, the substrate, and the C-shaped pickup plate until the clamp reaches its lowest position; (c) continuing lowering the susceptor top plate together with the substrate and the C-shaped pickup plate without the clamp until the C-shaped pickup plate reaches its lowest position, thereby creating a gap between the top ring potion of the clamp and the substrate; (d) continuing lowering the susceptor top plate alone until the susceptor top plate reaches its lowest position, thereby creating a gap between the substrate and the susceptor top plate, wherein the substrate is supported on the C-shaped pickup plate without contacting the susceptor top plate; (e) inserting a robot hand in the gap between the substrate and the susceptor top plate; and (f) picking up the substrate with the robot hand from the C-shaped pickup plate and retreating the substrate.

In yet another embodiment wherein one or more of the above objects can be achieved, the present invention provides a method for transferring a substrate using the foregoing clamp mechanism, comprising: (A) placing a substrate on a robot hand and moving the substrate over the C-shaped pickup plate, wherein the clamp, the C-shaped pickup plate, and the susceptor top plate are disposed at their lowest positions; (B) placing the substrate on the C-shaped pickup plate and retreating the robot hand; (C) raising the susceptor top plate until the susceptor top plate touches the C-shaped pickup plate, thereby supporting the substrate on the substrate supporting surface; (D) continuing raising the susceptor top plate together with the substrate and the C-shaped pickup plate until the substrate touches the top ring portion of the clamp, thereby detaching the C-shaped pickup plate from the clamp; and (E) continuing raising the susceptor top plate together with the substrate, the C-shaped pickup plate, and the clamp until the susceptor top plate reaches its highest position, thereby clamping the substrate on the substrate supporting surface.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

Figure 1:
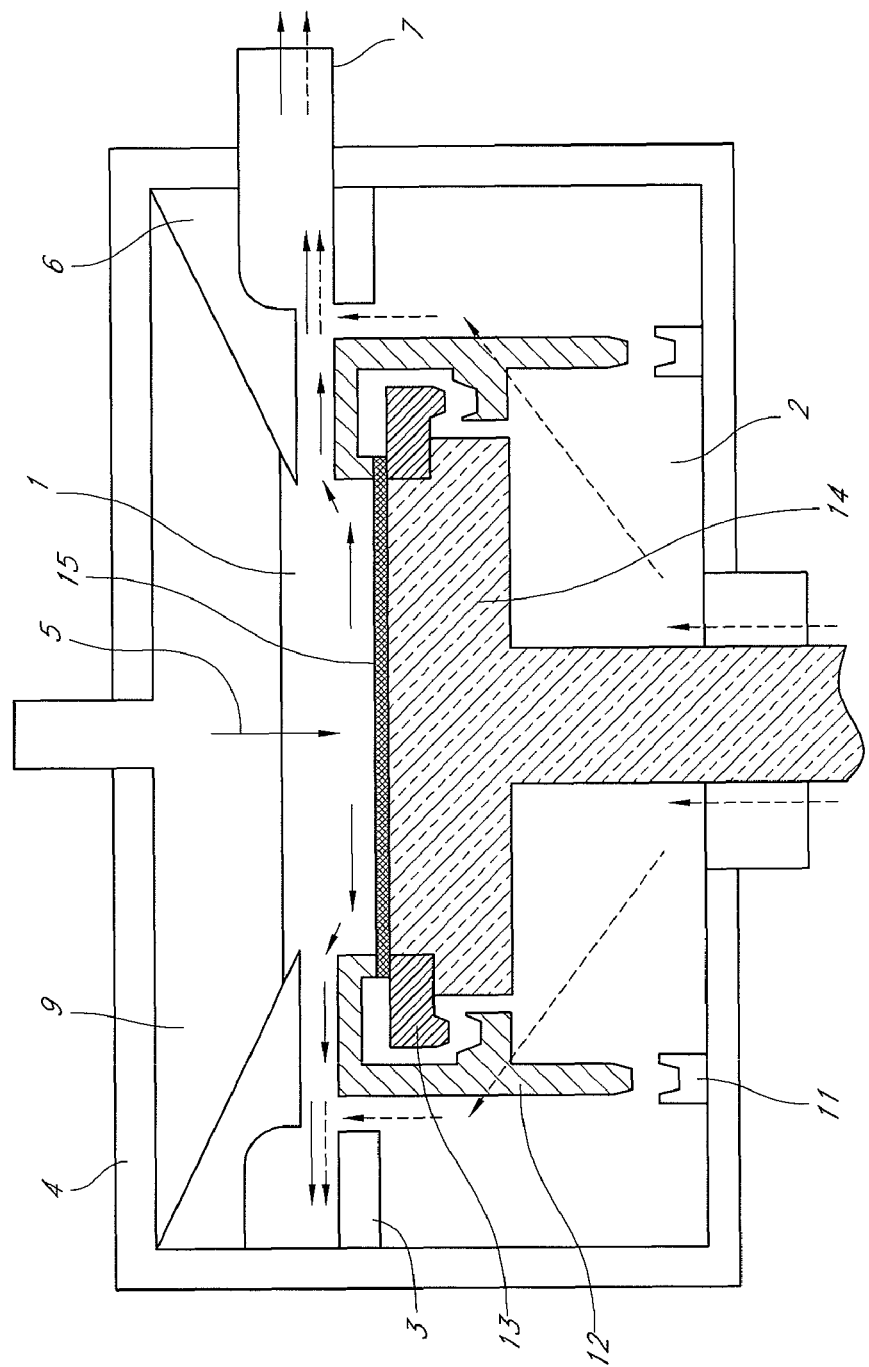
FIG. 1 is a schematic diagram of a substrate processing apparatus according to an embodiment of the present invention.
Figure 2A:
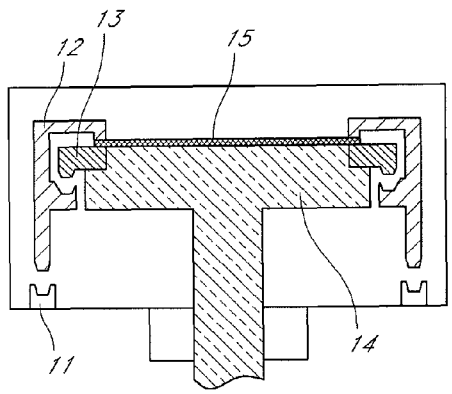
FIGS. 2(a) to 2(f) are schematic diagrams showing wafer transfer steps according to an embodiment of the present invention.
Figure 2B:
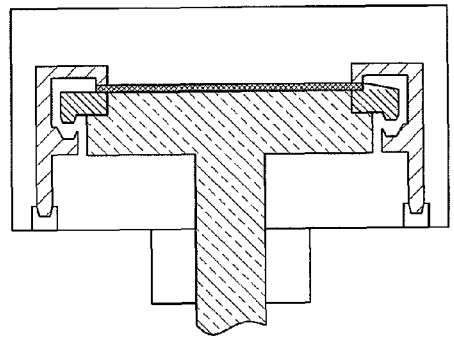
Figure 2C:
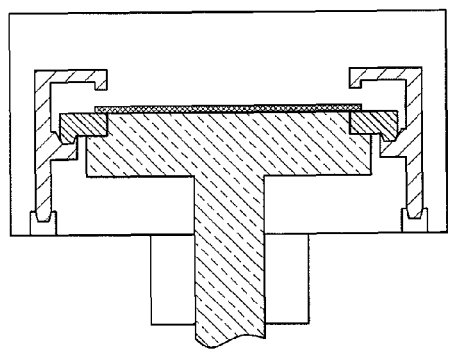
Figure 2D:
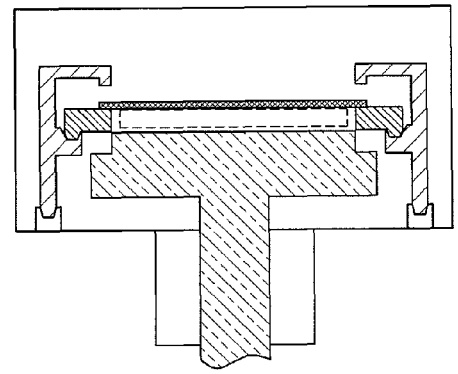
Figure 2E:
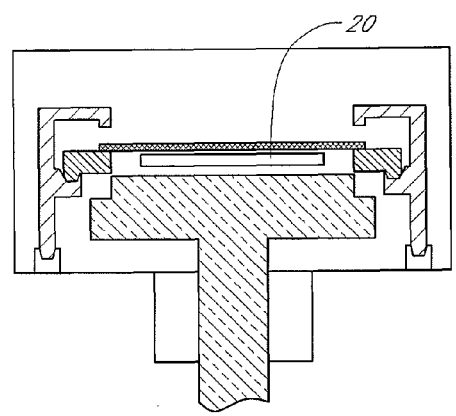
Figure 2F:
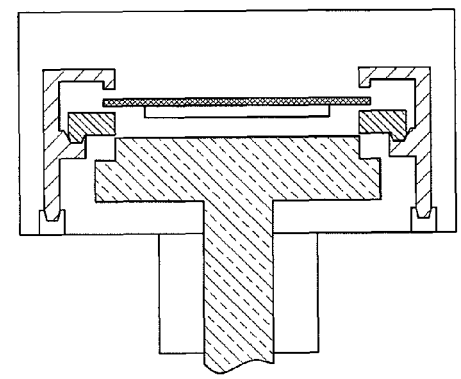

The present invention will be explained in detail with reference to preferred embodiments and drawings. However, the preferred embodiments and drawings are not intended to limit the present invention.

With reference to FIGS. 1, 4, 5(a)-5(c), and FIG. 6, in an embodiment, the present invention provides a clamping mechanism for a semiconductor substrate comprising: (I) a C-shaped pickup plate (a semi circular plate: 13) having an inner periphery portion 13a, an outer periphery portion 13b, and a cutout portion 133; (II) a susceptor top plate 14a having a periphery 141 adapted to receive and support the inner periphery portion 13a of the C-shaped pickup plate thereon so as to move upward together with the C-shaped pickup plate, wherein a substrate supporting surface 16 for placing a semiconductor substrate 15 thereon is constituted by a top surface of the C-shaped pickup plate 13 and a top surface of the susceptor top plate 14a; (III) a clamp 12 comprising (i) a top ring portion 12a for clamping the substrate by sandwiching a periphery of the substrate between the top ring portion 12a and the substrate supporting surface 16 and (ii) a pickup plate supporting portion 12c adapted to support the outer periphery portion of the C-shaped pickup plate 13, wherein the C-shaped pickup plate 13 is movable between the top ring portion 12a and the pickup plate supporting portion 12c, and the clamp 12 is movable upward together with the C-shaped pickup plate 13 and the susceptor top plate 14a. The susceptor top plate 14a may have no through-hole for a wafer lift pin.

The above embodiment further includes, but is not limited to, the following embodiments:

The periphery of the susceptor top plate 14a may be a C-shaped peripheral recess 141 adapted to receive and support the inner periphery portion 13a of the C-shaped pickup plate. In another embodiment, the recess need not be formed. The C-shaped peripheral recess 141 may have a height (e.g., 3-7 mm) equal to a thickness of the inner periphery portion 13a of the C-shaped pickup plate 13, so that a top surface of the susceptor top plate 14a can be leveled with a top surface of the C-shaped pickup plate 13, constituting the substrate supporting surface 16. A portion 142 of the susceptor top plate 14a corresponding to the cutout 133 of the C-shaped pickup plate 13 is formed (FIG. 5(a)), so that substantially or nearly no gap is formed between the substrate and the substrate supporting surface 16. In an embodiment, the top surface of the susceptor top plate 14a may be curved (e.g., concave). The depth of the recess 141 may be 3-5 mm (where the C-shaped pickup plate is supported) in an embodiment. The width of the C-shaped pickup plate may be 15-20 mm (a difference between an inner diameter and an outer diameter) in an embodiment. Further, a width of an area defined from the outer periphery of the substrate where no deposition occurs because the area is covered by the top ring portion of the clamp may be as small as 0.8-1.2 mm in an embodiment. The thickness of the top ring portion of the clamp may be 1-4 mm in an embodiment.

Figure 4:
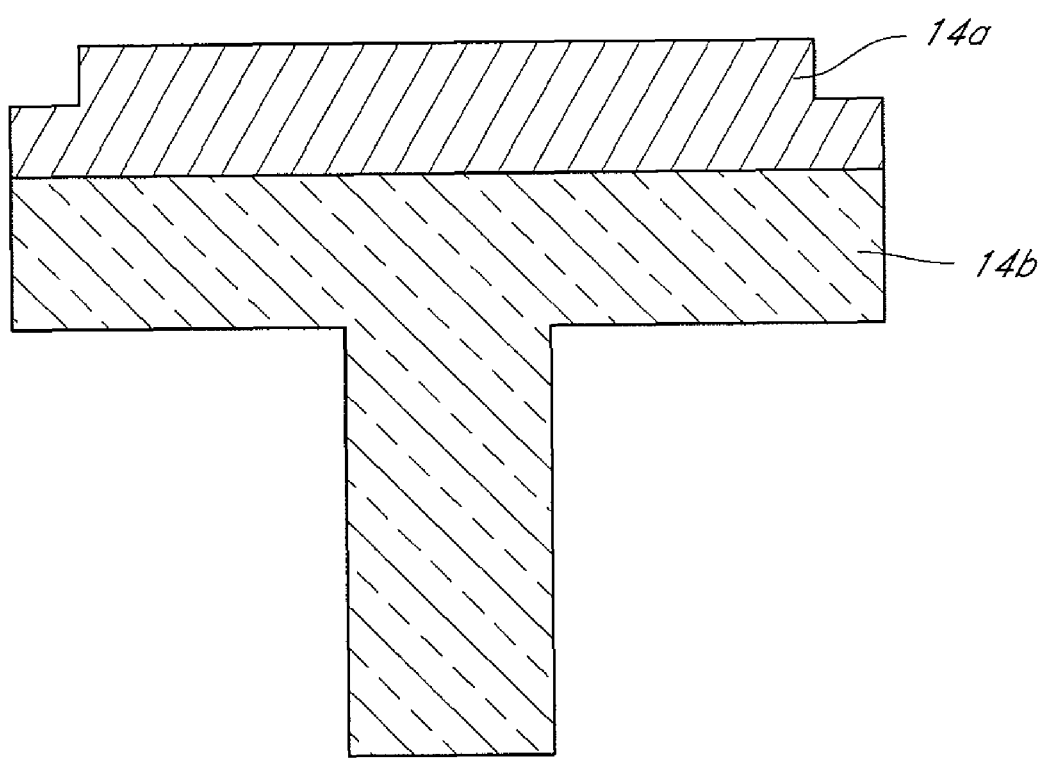
FIG. 4 is a schematic diagram showing a susceptor according to an embodiment of the present invention.
Figure 5B:
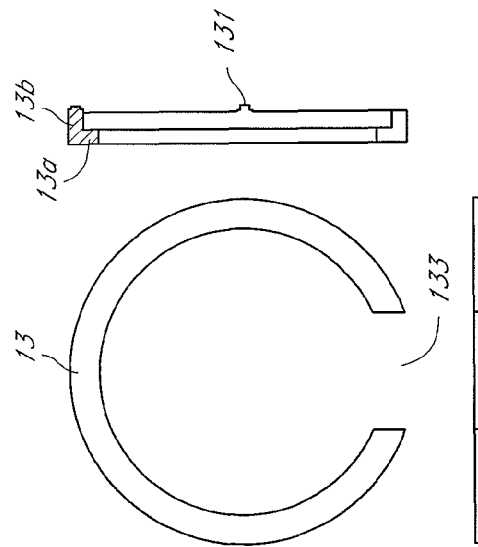
FIG. 5(b) is a schematic diagram showing a C-shaped pickup plate according to an embodiment of the present invention.
Figure 5C:
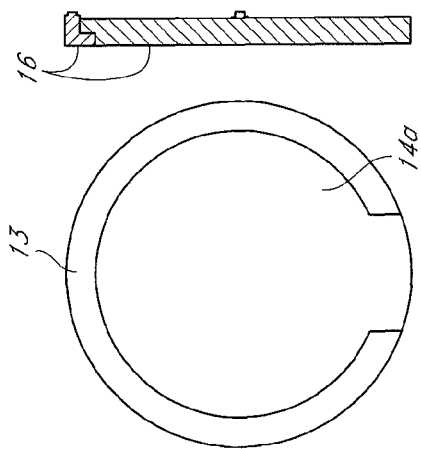
FIG. 5(c) is a schematic diagram showing the C-shaped pickup plate fitted in the susceptor top plate and according to an embodiment of the present invention. Each figure includes a top view, a front view, and a side cross sectional view.
Figure 5A:
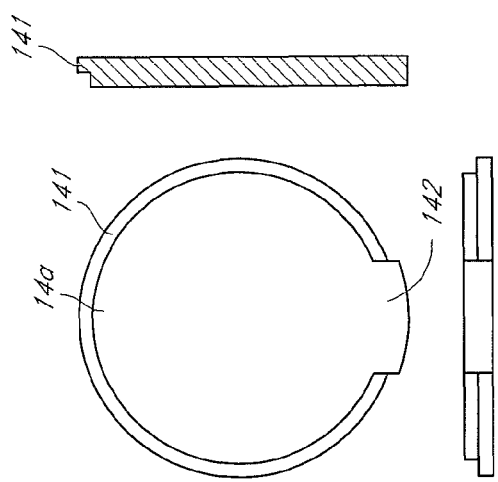
FIG. 5(a) is a schematic diagram showing a susceptor top plate according to an embodiment of the present invention.

The outer periphery portion 13b of the C-shaped pickup plate 13 may have a thickness greater than a thickness of the inner periphery portion 13a of the C-shaped pickup plate 13. Due to this configuration, the C-shaped pickup plate 13 can be accurately fitted to the susceptor top plate 14a. In an embodiment, the outer periphery portion of the C-shaped pickup plate may have a thickness equal to a thickness of the inner periphery portion of the C-shaped pickup plate, as long as the outer periphery potion of the C-shaped pickup plate can be lifted by the pickup plate supporting portion 12c of the claim 12. In an embodiment as shown in FIG. 4, the top plate 14a and the heater 14b are connected and constitute a susceptor, but a susceptor can be made of a single part. In another embodiment, the top plate may have a diameter smaller than that of the heater, so that the heater can receive and support the C-shaped pickup plate.

The C-shaped pickup plate 13 may have an inner diameter equal to an inner diameter of the top ring portion 12a of the clamp 12, so that the substrate 15 can be clamped securely by sandwiching the periphery of the substrate between the inner periphery portion of the C-shaped pickup plate and the top ring portion of the clamp.

Figure 6:
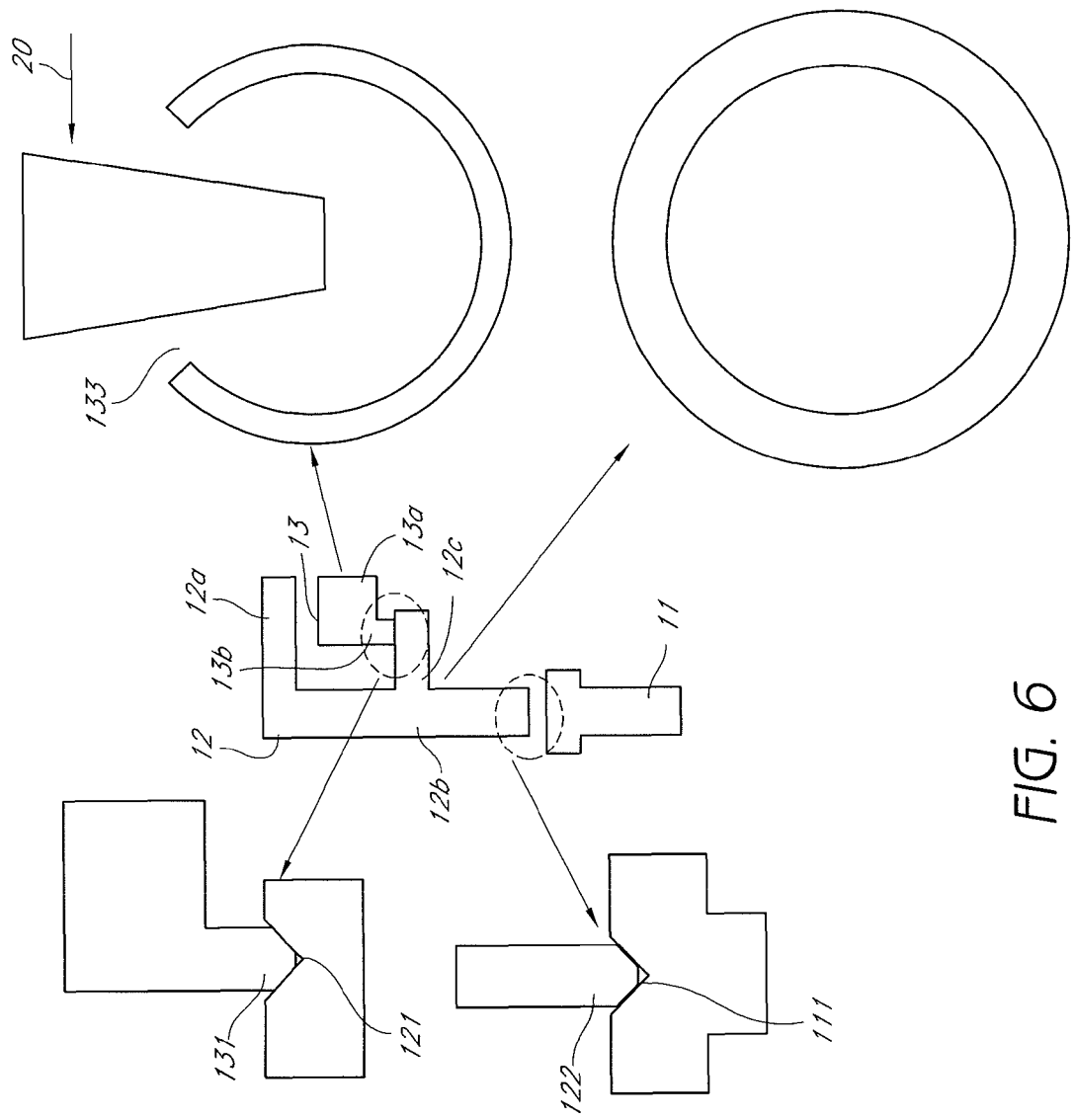
FIG. 6 is a schematic diagram showing a C-shaped pickup plate, a clamp, and a pin according to an embodiment of the present invention.
Figure 7C:
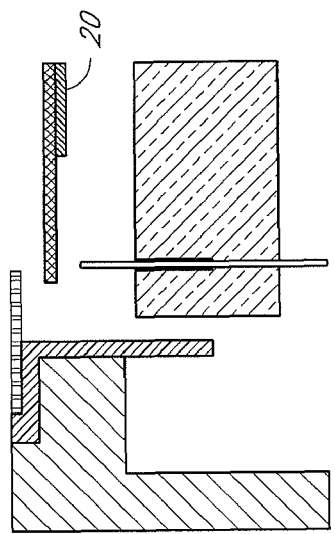
FIGS. 7(a) to 7(c) are schematic diagrams showing conventional wafer transfer steps.
Figure 7B:
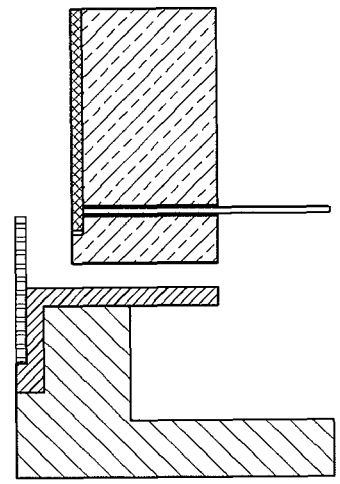
Figure 7A:
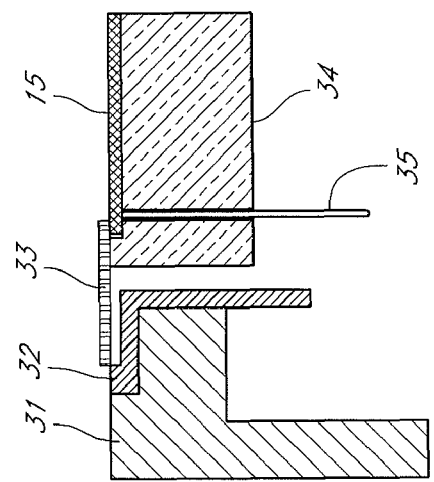

The outer periphery portion 13b of the C-shaped pickup plate 13 may have a bottom surface having at least one convex portion 131, and the pickup plate supporting portion 12c of the clamp 12 may have a top surface having at least one concave portion 121 corresponding to and fitted to the at least one convex portion 131 so as to maintain designed positions of the C-shaped pickup plate 13 and the pickup plate supporting portion 12c of the clamp 12 relative to each other when the C-shaped pickup plate 13 and the pickup plate supporting portion 12c are detached and attached (FIG. 6). This may be referred to as a self-positioning system. Typically, more than one convex portion and more than one concave portion are necessary. However, depending on the shape of the convex and concave portions, one of each can be sufficient (e.g., in the case of a trigonal pyramid). Further, the convex and concave portions may be a continuous convex portion and a groove. Further, the convex and concave portions can be formed on the pickup plate supporting portion 12a and the outer periphery potion of the C-shaped pickup plate 13, respectively.

Figure 3B:
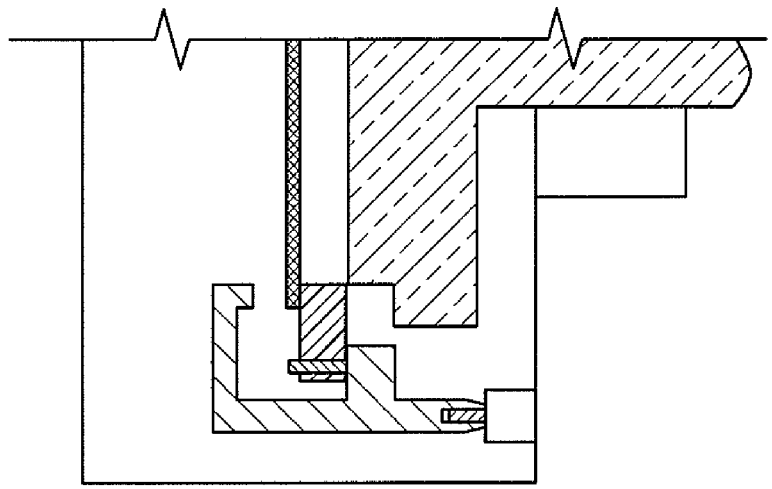
FIGS. 3(a) and 3(b) are schematic drawings illustrating a clamping mechanism according to an embodiment of the present invention, where the susceptor is at an upper position in FIG. 3(a) and at a lower position in FIG. 3(b).
Figure 3A:
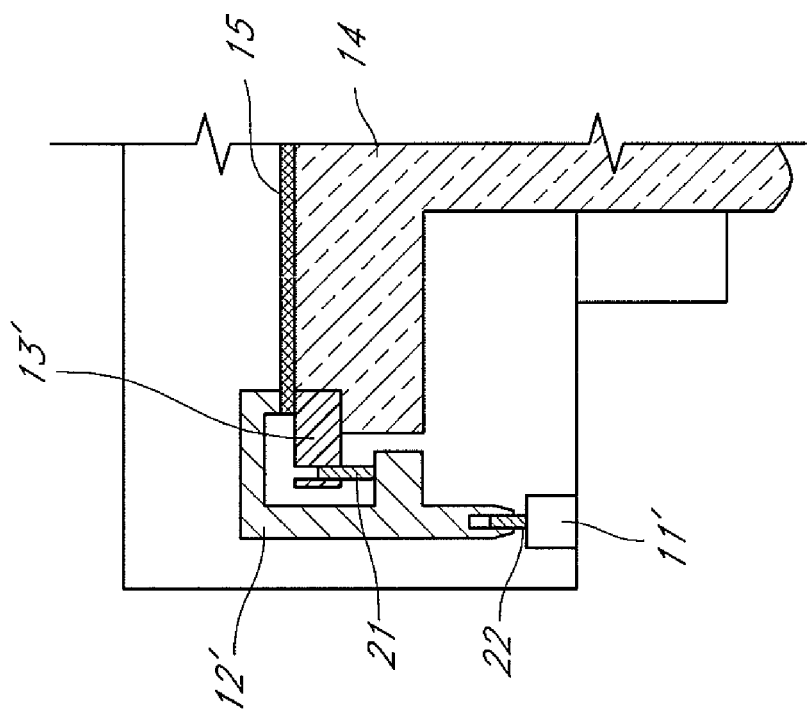

Instead of the convex and concave portions explained above, as shown in FIGS. 3(a) and 3(b), the C-shaped pickup plate 13' can have a through hole through which a pin 21 formed on the pickup plate supporting portion is inserted, so that the designed positions of the C-shaped pickup plate and the pickup plate supporting portion can be accurately maintained. Likewise, the clamp 12' can have a through hole through which a pin 22 formed on the pin 11' is inserted.

The clamping mechanism may further comprise multiple pins 11 for supporting the clamp 12 at a bottom of the clamp 12. The bottom of the clamp 12 may have at least one convex portion 122, and the pins 11 may have at least one concave portion 111 corresponding to the at least one convex portion so as to maintain designed positions of the clamp and the pins relative to each other when the clamp and the pins are detached and attached (FIG. 6). This is also a self-positioning system. As with the configurations of the C-shaped pickup plate and the pickup plate supporting portion, depending on the shape of the convex and concave portions, one convex portion and one concave portion can be sufficient (e.g., in the case of a trigonal pyramid). Further, the convex and concave portions may be a continuous convex portion and a groove. Further, the convex and concave portions can be formed on the pins 11 and the clamp 12, respectively.

Due to the self-positioning systems, positional deviations of the top ring portion 12a of the clamp 12 relative to the periphery of the substrate can effectively be inhibited, so that no periphery of the substrate may be exposed to the process gas, thereby inhibiting entry of the process gas into a back side surface of the substrate. As described earlier, according to the conventional clamping mechanism.

As the pins 11, three or more pins may be used. The pins can be movable to raise the clamp. However, the pins need not be movable but can be fixed at a bottom of the chamber because the susceptor moves vertically and the clamp is simply suspended.

The clamp may have an F-shaped vertical cross section, wherein the long horizontal portion of the F-shape corresponds to the top ring portion 12a, and the short horizontal portion of the F-shape corresponds to the pickup plate supporting portion 12c. The pickup plate supporting portion 12c may be ring-shaped but also can be composed of multiple protrusions inwardly extending as long as the pickup plate supporting portion can support the C-shaped pickup plate 13.

The cutout 133 of the C-shaped pickup plate 13 may be configured to allow a robot hand 20 to place and pick up the substrate 15 on and from the C-shaped pickup plate 13.

With reference to FIG. 1, in another aspect, the present invention provides a semiconductor processing apparatus comprising: (i) a chamber 4 comprised of a reaction chamber 1 and a transfer chamber 2; (ii) a showerhead 9 disposed inside the chamber; (iii) a susceptor heater 14b which is vertically movable and disposed inside the chamber facing the showerhead 9; and (iv) any one of the foregoing clamping mechanism wherein the susceptor top plate 14a is attached on top of the susceptor heater 14b. The semiconductor processing apparatus may further comprise a separation plate 3 which separates the reaction chamber 1 and the transfer chamber 2, wherein a top surface of the top ring portion 12a of the clamp 12 are substantially or nearly leveled with a top surface of the separation plate 3 while processing the substrate 15 so as to allow gas to continuously flow over the top surface of the top ring portion 12a and the top surface of the separation plate 3 after a process gas or a purge gas (indicated by arrows with solid lines) is introduced into the reaction chamber 1 through the showerhead 9 as shown in FIG. 1. The gas is discharged from an exhaust duct 6 to an exhaust system 7. In the configuration of FIG. 1, there is a gap between the separation plate 3 and the clamp 12 so that a purge gas (indicated by arrows with broken lines) can pass through the gap to inhibit the reaction gas from entering into the transfer chamber.

With reference to FIGS. 2(a) to 2(f), in still another aspect, the present invention provides a method for transferring a substrate using any one of the foregoing clamp mechanism, comprising: (a) processing a substrate 15 placed on the substrate supporting surface constituted by the C-shaped pickup plate 13 and the susceptor top plate 14, wherein the substrate 15 is clamped between the top ring portion 12 and the substrate supporting surface by clamping the periphery of the substrate 15 by the ring portion of the clamp 12, wherein the clamp is suspended and its own weight of the claim is exerted on the periphery of the substrate 15 (FIG. 2(a)); (b) lowering the susceptor top plate 14 together with the clamp 12, the substrate 15, and the C-shaped pickup plate 13 until the clamp 12 reaches its lowest position (where the clamp 12 becomes in contact with the pins 11) (FIG. 2(b)); (c) continuing lowering the susceptor top plate 14 together with the substrate 15 and the C-shaped pickup plate 13 without the clamp 12 until the C-shaped pickup plate 13 reaches its lowest position (where the lower end of the C-shaped pickup plate becomes in contact with the pickup plate supporting portion of the clamp 12), thereby creating a gap between the top ring potion of the clamp 12 and the substrate 15 (FIG. 2(c)); (d) continuing lowering the susceptor top plate 14 alone until the susceptor top plate 14 reaches its lowest position, thereby creating a gap between the substrate 15 and the susceptor top plate 14, wherein the substrate 15 is supported on the C-shaped pickup plate 13 without contacting the susceptor top plate 14 (FIGS. 2(d)); (e) inserting a robot hand 20 in the gap between the substrate 15 and the susceptor top plate 14 (FIGS. 2(e); and (f) picking up the substrate 15 with the robot hand 20 from the C-shaped pickup plate 13 and retreating the substrate 15 (FIG. 2(f)). In an embodiment, the C-shaped pickup plate and the clamp may be made of ceramics. The susceptor top plate may be made of aluminum.

In yet another embodiment, the present invention provides a method for transferring a substrate using any one of the foregoing clamp mechanism, which method concerns the reversed direction, i.e., loading a wafer to processing the wafer (as compared with the direction of processing a wafer to unloading the wafer shown in FIGS. 2(a) to 2(f)). Typically, the steps can be simply revered. For example, the method may comprise (A) placing a substrate on a robot hand and moving the substrate over the C-shaped pickup plate, wherein the clamp, the C-shaped pickup plate, and the susceptor top plate are disposed at their lowest positions; (B) placing the substrate on the C-shaped pickup plate and retreating the robot hand; (C) raising the susceptor top plate until the susceptor top plate touches the C-shaped pickup plate, thereby supporting the substrate on the substrate supporting surface; (D) continuing raising the susceptor top plate together with the substrate and the C-shaped pickup plate until the substrate touches the top ring portion of the clamp, thereby detaching the C-shaped pickup plate from the clamp; and (E) continuing raising the susceptor top plate together with the substrate, the C-shaped pickup plate, and the clamp until the susceptor top plate reaches its highest position, thereby clamping the substrate on the substrate supporting surface.

According to any one of the foregoing embodiments, unwanted deposition of film on a back surface and an edge portion of a substrate can effectively be inhibited. Further, because no through holes for lift pins may be formed in the susceptor, entry of a process gas into the back side of the substrate can effectively be inhibited, thereby inhibiting unwanted deposition of film on the back surface of the substrate. Further, without lift pins, the substrate can be transferred. Furthermore, due to the accurate positioning of the clamp and the C-shaped pickup plate, an area where no deposition occurs can be minimized, and an area where a film is formed can be maximized.

As explained above, with traditional methods, especially with the atomic layer deposition process where a film is formed by sequentially changing gases, a large pressure variation in each of the gas change and purge steps causes gases to flow from the transfer chamber to the reaction chamber through the through holes for wafer lift pins, and other problems such as increased gas change time and generation of particles also occur on ALD apparatuses where gases needs to be changed quickly. According to an embodiment of the present invention, however, these problems can be solved effectively. Also, as explained earlier, when the traditional clamp is used it is necessary to consider A (margin for the chamber wall and guide ring)+B (margin for the guide ring and clamp)+C (margin for the clamp and susceptor)+D (margin for the susceptor top and wafer)+E (transfer accuracy of the robot) to achieve proper positioning with the wafer on the susceptor. Accordingly, a margin of approx. 1 mm is needed when the materials, temperatures, expansion coefficients, machining accuracies and safety factors of respective parts are considered, and therefore a structure becomes necessary where the outer periphery of the wafer is clamped by 1.5 mm or more to completely prevent forming of film on the back side. In this case, the worst level of positional deviation can create an area with a dimension of anywhere from 2.5 mm at the maximum to 0.5 mm at the minimum around the outer periphery of the wafer where film is not formed, and this reduces the in-plane uniformity. In an embodiment conforming to the present application for patent, on the other hand, the wafer is directly transferred to the pickup plate provided on the clamp mechanism and therefore only C (margin for the susceptor and pickup plate) and E need to be considered among the aforementioned factors, meaning that only a margin of approx. 0.3 mm is sufficient even when the expansion coefficients, machining accuracies and safety factors of respective parts are considered and consequently any clamp capable of covering approx. 0.8 mm at the outer periphery can be used. In this case, even the worst level of positional deviation creates only an area with a dimension of anywhere from 1.1 mm at the maximum to 0.5 mm at the minimum around the outer periphery of the wafer where film is not formed, and this ensures that a film is formed uniformly in a favorable manner.

In the present disclosure where conditions and/or structures are not specified, the skilled artisan in the art can readily provide such conditions and/or structures, in view of the present disclosure, as a matter of routine experimentation. Also, in the present disclosure, the numerical numbers applied in embodiments can be modified by a range of at least ±50% in other embodiments, and the ranges applied in embodiments may include or exclude the endpoints.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A clamping mechanism for a semiconductor substrate comprising:

a C-shaped pickup plate having an inner periphery portion, an outer periphery portion, and a cutout portion, the C-shaped pickup plate having a top surface for contacting and supporting a semiconductor substrate thereon;

a susceptor top plate having a periphery adapted to receive and support the inner periphery portion of the C-shaped pickup plate thereon so as to move upward together with the C-shaped pickup plate, wherein a substrate supporting surface for placing a semiconductor substrate thereon is constituted by the top surface of the C-shaped pickup plate and a top surface of the susceptor top plate, the outer periphery portion of the C-shaped pickup plate having a diameter greater than that of the susceptor top plate; and a clamp comprising (i) a top ring portion for clamping the substrate by contacting and downwardly pressing a periphery of the substrate against the top surface of the C-shaped pickup plate and (ii) a pickup plate supporting portion for lifting upward, apart from the susceptor top plate, the outer periphery portion of the C-shaped pickup plate together with the substrate placed on the top surface of the C-shaped pickup plate, wherein the top ring portion and the pickup plate supporting portion are fixedly vertically distanced, and the top ring portion, the pickup plate portion, and the C-shaped pickup plate are in vertical alignment such that the C-shaped pickup plate is movable between the top ring portion and the pickup plate supporting portion, and the top ring portion, the C-shaped pickup plate, and the susceptor top plate are in vertical alignment such that the clamp is movable upward together with the C-shaped pickup plate and the susceptor top plate, wherein the clamp has an upright F-shaped vertical cross section, wherein the long horizontal portion of the F-shape corresponds to the top ring portion, and the short horizontal portion of the F-shape corresponds to the pickup plate supporting portion.

* * * * *